United States Patent [19]
Gomi et al.

[11] Patent Number: 5,662,782
[45] Date of Patent: Sep. 2, 1997

[54] METHOD AND APPARATUS FOR ADJUSTING A RESONANCE FREQUENCY OF PIEZOELECTRIC ELEMENTS

[75] Inventors: Takeshi Gomi; Yukihiro Endo, both of Nagano-ken, Japan

[73] Assignee: Seiko Epson Corporation, Tokyo, Japan

[21] Appl. No.: 393,836

[22] Filed: Feb. 24, 1995

[30]   Foreign Application Priority Data

May 26, 1994 [JP] Japan ........................ 6-113041
Dec. 21, 1994 [JP] Japan ........................ 6-318928

[51] Int. Cl.$^6$ ................. C23C 14/32; H01L 21/3063; B05D 5/12
[52] U.S. Cl. ............ 204/192.34; 204/192.18; 204/192.32; 204/192.33; 204/298.32; 204/298.35; 204/298.36; 156/345; 216/59; 216/61; 216/66; 216/67; 427/100; 438/13
[58] Field of Search .................. 204/192.18, 192.32, 204/192.33, 192.34, 298.31, 298.32, 298.35, 298.36; 156/345, 626.1, 627.1, 643.1, 656.1; 216/59, 61, 66, 67; 427/100; 29/25.35

[56]         References Cited
U.S. PATENT DOCUMENTS 3,914,836 10/1975 Hafner et al. ................. 29/25.35
4,389,275  6/1983 Ballato ........................ 216/59
4,454,639  6/1984 Dworsky et al. ............. 29/25.35
4,927,484  5/1990 Mitomi ........................ 156/345
5,407,525  4/1995 Michel et al. ................ 156/345

*Primary Examiner*—Robert Kunemund
*Assistant Examiner*—Rodney G. McDonald
*Attorney, Agent, or Firm*—Oliff & Berridge

[57]             ABSTRACT

An apparatus and method for manufacturing resonant elements such as piezoelectric elements, quartz resonators and other resonant elements while monitoring and regulating the resonance frequencies of the elements are disclosed. A radiation source such as an ion gun provides a plasma to selectively remove portions of an electrode on the resonant element to increase the resonance frequency. The distance between the radiation source and the electrode may be varied while monitoring the resonance frequency and the distance adjusted based on the measured resonance frequency. Different stages with increasing distances between different radiation sources and the resonant element to provide consecutively finer adjustment may be used to consecutively bombard the electrode with ions, with the resonant element being conveyed to the different stages. Oscillators and related devices using the resonant elements are also disclosed.

33 Claims, 14 Drawing Sheets

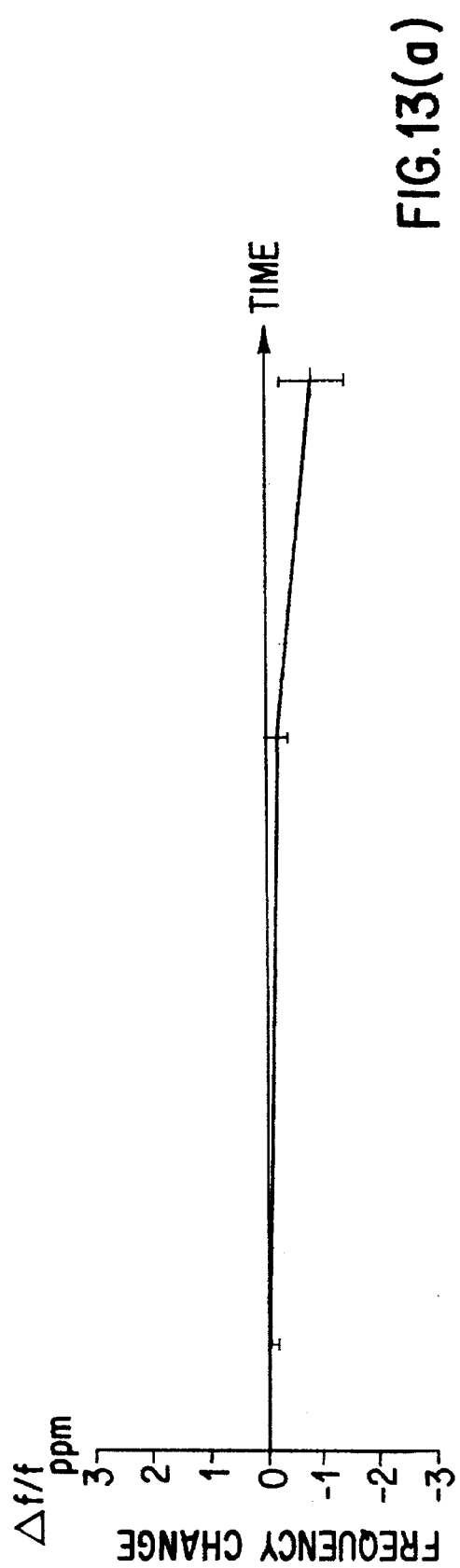
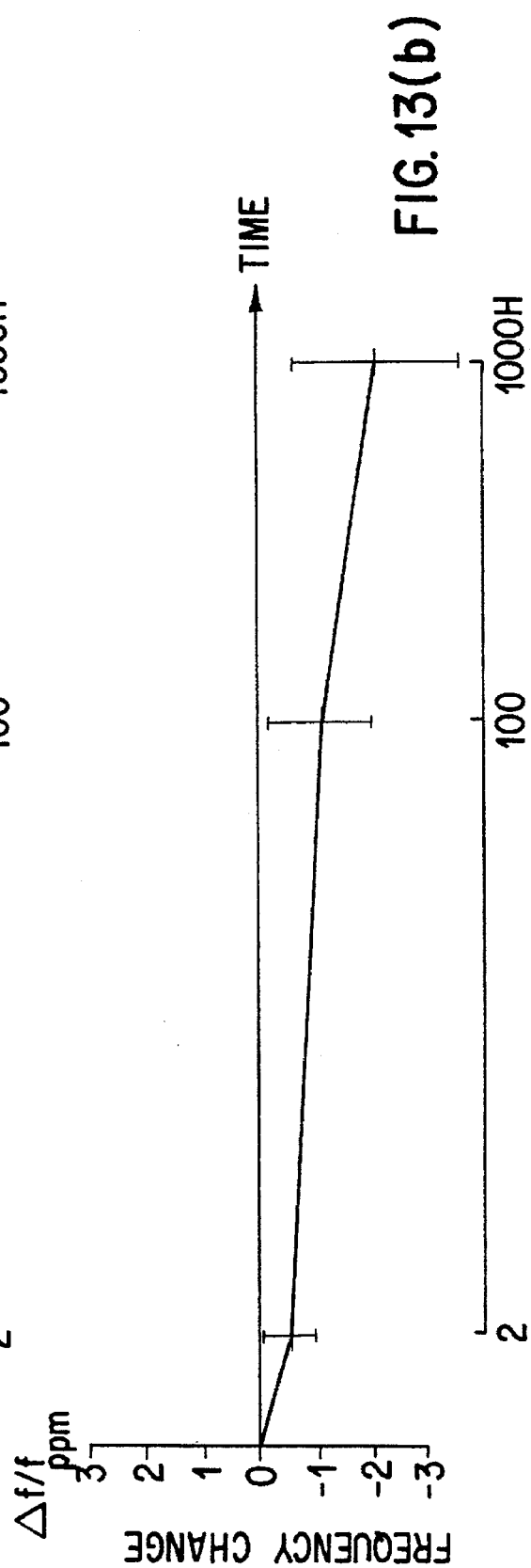
FIG.13(a)
FIG.13(b)

METHOD AND APPARATUS FOR ADJUSTING A RESONANCE FREQUENCY OF PIEZOELECTRIC ELEMENTS

BACKGROUND OF THE INVENTION

1. Field of the Invention

This invention relates to an apparatus and method for processing piezoelectric elements, quartz resonators and other resonant elements while monitoring and regulating the resonance frequencies of the elements, piezoelectric elements produced by such apparatus and method, and resonators and related devices using such elements.

2. Description of Related Art

In a generally recognized frequency adjustment method for the regulation of the frequency of piezoelectric elements in quartz resonators, deposition is done through a mask during manufacture in order to directly obtain the desired frequency. Alternatively, in recent years, sputter-etching and ion beam radiation with an ion gun has been used to remove material from an electrode in order to obtain the desired resonance frequency, in a so-called plasma frequency adjustment method.

According to a frequency adjustment method using a plasma, initially a specified amount of the piezoelectric parent material is cut out, forming an angular cut, following which it is polished, to finish the piezoelectric form. Following the alignment of a mask patterned after the shape of the electrode to one surface of the piezoelectric form, a silver metallic film is deposited in a vacuum, thereby forming the base electrode. Unlike the frequency adjustment method of deposition accomplished under the related art, the frequency is controlled during deposition by monitoring the film thickness so that the resonance frequency can be set 500–2000 ppm lower than the desired resonance frequency.

The manufacture results in the film thickness being greater than that of the electrode film thickness for the desired resonance frequency.

The piezoelectric element which is provided with an electrode formed in the manner described is mounted in an appropriate holder, and through the application of sputter-etching or ion beam radiation, the thickness of the electrode is reduced by removal of material from an electrode, thereby increasing the resonance frequency, in order to obtain the desired resonance frequency. When accomplishing the regulation of frequency in the manner described, initially the resonance frequency of the piezoelectric element is measured to determine how far the resonance frequency differs from the desired final resonance frequency. The processing rate for accomplishing the frequency adjustment of the piezoelectric element is established on the basis of the measured sputter-etching or the intensity of the ion beam, and the sputter-etching or ion beam radiation time can be determined for various processing rates and frequency differences from the desired resonance frequency.

Next, radiation is commenced on the basis of the determined rates and times. The measurement system cannot be used effectively because there is a direct flow of electric current on the piezoelectric element. Therefore, before the full radiation time is completed, the radiation is cut off, the electrical system is reconnected, and the resonance frequency of the piezoelectric element is measured to determine the resonance frequency and the difference from the desired resonance frequency. Through repetition of this operation, the frequency difference may be reduced to nearly zero.

With the related art frequency adjustment method in which use is made of deposition directly to make the frequency adjustment, it is essential that a slow deposition process be used. Furthermore, it is essential that the mask used to restrict the portion of deposition be one of high precision, which is extremely costly in equipment and operational time. In addition, the accuracy of the frequency adjustment has not been very high. In contrast, with the frequency adjustment method in which use has been made of plasma, the operational time is shortened, reducing production costs, and there is the added benefit that the frequency adjustment is also more precise.

However, even with the frequency adjustment method using a plasma, there are a number of problems which need to be resolved. First of all, since a direct electric current flows on the piezoelectric element or other workpiece, the resonance frequency during the adjustment of the frequency has not been able to be monitored. Because of this, the radiation time has been established from the processing rate, and there has been no alternative except to adjust the frequency by controlling this time.

The processing rate which determines the radiation time can be calculated based on the size of the electrode and a number of other factors. However, even with the same frequency band, there will be individual differences in processing the various piezoelectric elements. In addition, there are a number of processing factors which affect the processing rate, such as the stability of the sputter gun or the ion beam gun source, and the atmosphere of the processing device. Also, it is very difficult to coordinate and to control those factors. Thus, if control is exercised only over the radiation time, the resonance frequency following the frequency adjustment will deviate from the desired resonance frequency. Therefore, the radiation time is divided by frequency measurements and adjustments of the radiation time are made in coordination with the resonance frequency measurements. Since it is necessary to repeat such steps as radiation, frequency measurement, etc. many times, shortening of the processing time is not effectively accomplished. In addition, since the radiation is continuously operated in order to assure a high degree of accuracy and the coordination of the final frequency, a high degree of experience is necessary to operate the processing device, making it difficult to automate.

There is also the problem of the processing rate. If the voltage and electrical current are impressed on the sputtering gun or ion gun in a fixed manner, then the radiation is of a fixed energy, and the processing rate also is maintained in a roughly fixed state. However, when there is a great difference between the desired resonance frequency of the workpiece and the measured frequency, then if a large processing rate is not obtained, the processing time becomes extended, and there is a deterioration in the manufacturing efficiency. On the other hand, when minute adjustments in the resonance frequency are needed, if the processing rate is not small, then there will not be a great deal of precision in the adjustment. A certain amount of precision can be assured through increasing the processing rate and using a shutter mechanism and the like. However, the processing device becomes complicated, and consideration needs to be given to a number of problems relating to its control and stability of operation. In addition, even if such mechanisms are used, a great improvement in the precision of the frequency is not expected.

By controlling the supply of electric current to the radiation source such as, for example, the ion gun, it is also possible to adjust the processing rate. However, if the processing rate is changed, then there is also a change in the processing time, and if there is not precise control of the energy of the ionized atoms, then the processing time cannot be established with a high degree of accuracy. Furthermore, it will also be difficult to monitor the resonance frequency, and even if the processing rate could be changed and the processing time shortened, ultimately it will be difficult to assure the accuracy of the frequency. In addition, in order to maintain the constant radiation emission from the radiation source, it may be necessary to supply electric power in greater than a fixed level, as well as to resolve instabilities in the radiation source originating in changes in electric power.

Through the use of a plasma, the method for frequency adjustment by reduction in the thickness of the electrode appears capable of a great improvement in precision with a shortening of the processing time. However, products with stable performance at low cost have not been achieved.

SUMMARY OF THE INVENTION

It is an object of the present invention to overcome these problems with manufacturing methods and devices that can practically supply to the market place piezoelectric elements or other workpieces such as, for example, other resonance elements and their associated devices in which the frequency has been adjusted by means of plasma. It is also an object of the present invention to provide manufacturing methods and devices in which the frequency adjustment can be accomplished in the production process by means of plasma with a high degree of efficiency in the frequency adjustment. Furthermore, it is an object of the present invention, through the use of manufacturing methods and apparatuses disclosed, to achieve precise frequency adjustment by means of plasma processing with means for emitting particles toward the resonance element, thereby producing piezoelectric elements and oscillating elements having stable performance at low cost.

With the present invention, in order to monitor the resonance frequency with a high degree of precision, a frequency measurement means, which may include a frequency measurement device, such as a network analyzer, for measuring the frequency is used. The frequency measurement means is connected to an electrode of the piezoelectric element or a portion of another type of resonant element or other workpiece arranged to conduct electricity through an electrical connection including a high pass frequency filter means which removes the direct current and low frequency components such as pulsating flow, thereby enabling changes in the resonance frequency during radiation to be monitored. The electrical connection which is capable of removing low frequency components may include a coil or coils connected to the ground level. By this means, current components which are not necessary for monitoring resonance frequency, such as direct current components, created by the radiation and which might cause damage to the measurement system, are eliminated.

Thus continuous processing for adjusting the resonance frequency becomes possible while monitoring the resonance frequency. Furthermore, since processing is simplified, the frequency adjustment process may also be incorporated into an automated production process, improving production efficiency. Furthermore, a capacitor which is optionally connected to an electrical coil allows the frequency measurement system to match with the users' oscillation circuit or frequency measurement system. In addition through the serial connection of resistance to the electrical coil, a reduction in the electric current during the initial period of radiation can be obtained.

According to the present invention, control can be exercised over the effective radiation strength when the radiation source, such as an ion gun, is in a stabilized state of particles emission, by control means which may include a control device that controls the distance between the radiation source and a workpiece, such as a piezoelectric element including an electrode, which is the object of the radiation. By changing the distance between the radiation source and an electrode, control can be exercised over the energy of the ionized gas irradiating an electrode without changing the energy output of the radiation source. Furthermore, under stabilized radiating conditions, it is possible with such control to achieve frequency adjustment with a high degree of precision.

By electrical communication means, such as an electrical connection, between the frequency measurement means and the control means, the measured resonance frequency can be used to change the distance between the radiation source and an electrode.

Moreover, according to the present invention, conveyance means for sequentially aligning an electrode with applied particle radiation in multiple divided steps with plural stages allows the time required for the processing operation to be shortened, thereby enabling production of a resonance element with a highly precise resonance frequency. That is, by using a relatively high processing rate and a relatively low processing rate in different processing steps and stages, it is possible to shorten the processing time and to precisely adjust the resonance frequency. In addition, by dividing the processing into different steps and stages, the ratio of the maximum value of the processing rate to the minimum value of the processing rate at each step or stage can be reduced. As a result, there is an increase in the stability of the device so that there is an improvement in reliability.

BRIEF DESCRIPTION OF DRAWINGS

FIG. 13(a) and FIG. 13(b) are graphs showing the aging characteristics of the change in the resonance frequency of the quartz resonator shown in FIG. 12(a) and FIG. 12(b) and a quartz resonator of the prior art respectively.

DETAILED DESCRIPTION OF THE PREFERRED EMBODIMENTS

Figure 1:
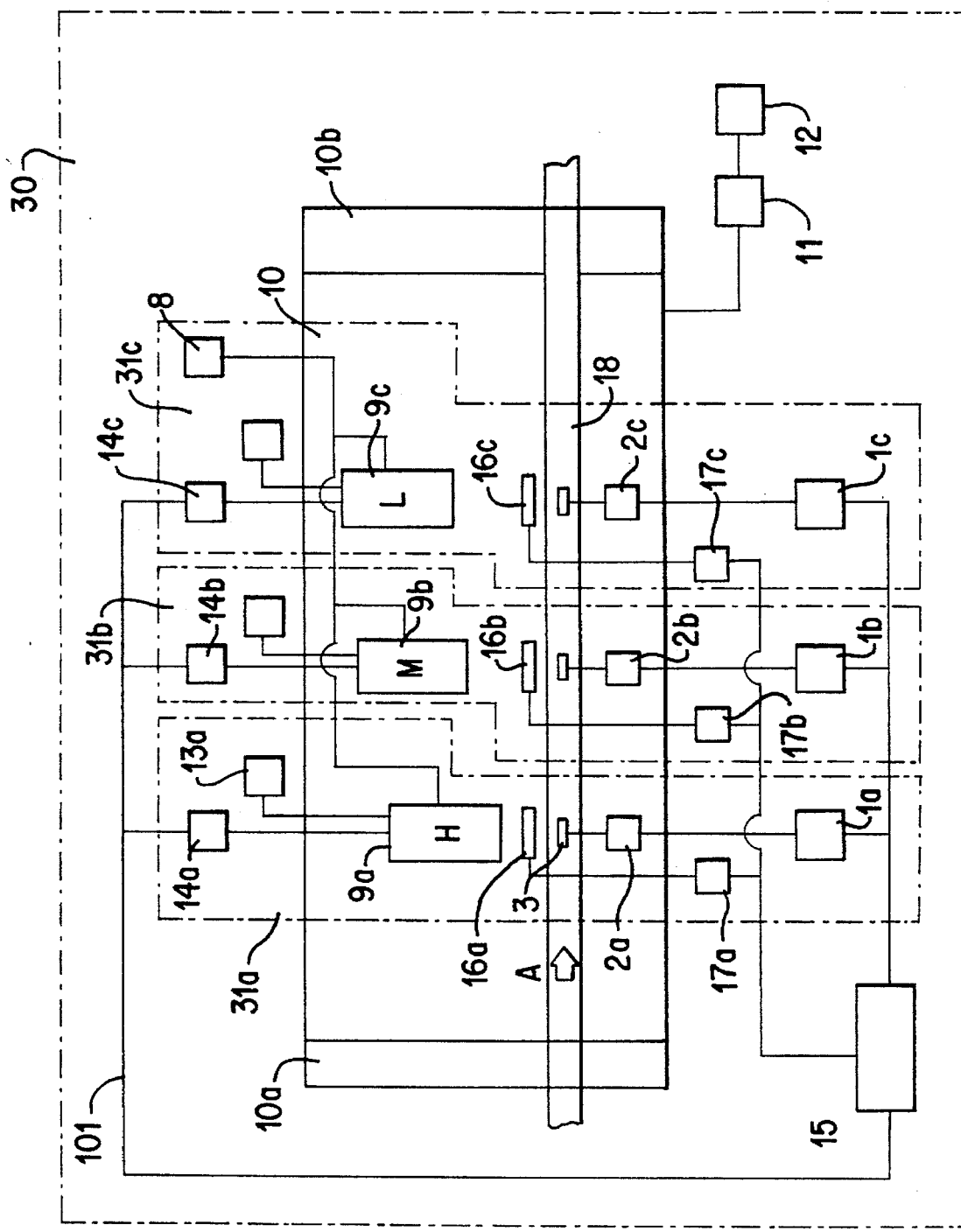
FIG. 1 is a block diagram that shows the processing device for accomplishing frequency adjustment in accordance with the present invention.

FIG. 1 shows an example of a processing apparatus 30 for adjusting the frequency of a resonant element such as a piezoelectric element in accordance with one aspect of the present invention. While in the following piezoelectric elements including electrodes will primarily be discussed for convenience of explanation, other resonant elements may be processed by the apparatuses and methods disclosed. The processing apparatus has three stages, 31a, 31b and 31c which are arranged in the direction indicated by the arrow A. A transport mechanism 18, which comprises a conveyor for transporting piezoelectric elements or other resonant elements or workpieces, can move in the direction indicated by arrow A. The primary stage 31a is used for the rough adjustment of the resonance frequency of the piezoelectric element. The secondary stage 31b is used for the intermediate adjustment of the resonance frequency. The third stage 31c is arranged for the fine adjustment of the final resonance frequency.

With the various stages 31a–31c, radiation on the piezoelectric element 3 is carried out by means of the transport mechanism which carries the piezoelectric element in the path of the ionized gas from the varying frequency adjustment sources of radiation 9a–9c. In the example of FIG. 1, ion guns are used as the frequency adjustment radiation sources 9a–9c. In addition, argon gas is the gas used. The mechanism for adjusting the position of the ion guns 9a–9c, the piezoelectric element 3 and the transport mechanism 18, as described hereafter, are housed within a vacuum chamber 10. The interior of the vacuum chamber 10, following the evacuation of air to the level of $10^{-3}$ Torr by means of a rotary pump 12 through a mechanical booster pump 11, is filled with argon gas from an argon gas supply source 8 until the interior reaches a level of $10^{-1}$–$10^{-2}$ Torr. Furthermore, a load lock chamber 10a is on the transport intake side of the vacuum chamber 10, and a load lock chamber 10b is on the transport exhaust side of the vacuum chamber 10. Each piezoelectric element 3 is mounted on conveyor transport 18 to be continuously transported to load lock chamber 10a into vacuum chamber 10 and then to load lock chamber 10b.

The piezoelectric element 3 is transported automatically by the conveyor transport mechanism 18 while subjected to radiation in the vacuum chamber 10 first at primary stage 31a, second at stage 31b, and third at stage 31c in order to adjust the resonance frequency of the piezoelectric element. The piezoelectric element 3, prior to its conveyance into the processing device 10 is provided with a deposited electrode comprised of silver, or an aluminum metal, which is formed on the surface of the piezoelectric form. The finished electrodes are slightly thicker than electrodes which provide the desired resonance frequency f0.

Furthermore, the resonance frequency f1 of the piezoelectric element conveyed into vacuum chamber 10 has a value which is slightly lower by about 2000 ppm than the desired resonance frequency f0. Gas ions are then radiated against the piezoelectric element, thereby reducing the thickness of the electrode, processing being accomplished by the device 30 of the present example until the resonance frequency f0 is reached.

The piezoelectric element introduced into vacuum chamber 10, 2000 ppm from the desired resonance frequency f0 is processed by means of the first stage 31a which provides a rough adjustment of the electrode thickness to a level of 200 ppm relative to the desired resonance frequency f0. The distance between the piezoelectric element 3 and the frequency adjustment source 9a is established at approximately 5 mm, which is closer than the frequency adjustment sources of the other stages, so that a relatively high processing rate of 800 ppm/second is obtained.

Intermediate adjustment of the electrode thickness is accomplished by the second stage 31b, by which the resonance frequency f1 of the roughly adjusted piezoelectric element 3 is brought to within 50 ppm relative to the resonance frequency f0. The distance between the work 3 and the frequency adjustment source 9b is established at approximately 10 mm so that a processing rate of approximately 100 ppm/second is obtained.

The third stage 31c is a stage for accomplishing the final fine adjustments of the electrode thickness, whereby the resonance frequency f1 of the piezoelectric element 3 is brought to 0 ppm relative to the desired resonance frequency f0. The distance between the piezoelectric element 3 and the radiation source 9c is established at approximately 20 mm. The processing rate can be brought to a level of minute adjustment by a processing rate of 20 ppm/sec.

The processing apparatus 30 of the present invention accomplishes the adjustment from 2,000 ppm to 0 ppm in a relatively short time by frequency adjustment in three different steps of processing. Furthermore, the final minute adjustment is reliably performed. Moreover, since the piezoelectric element is automatically conveyed between the three stages, stages 31a–31c, the piezoelectric element 3 can be continuously processed, allowing a plurality of piezoelectric elements to be simultaneously processed in different steps of the manufacturing process.

In addition, the radiation sources 9a–9c can be operated while continuous measurements of the resonance frequencies f1 of the individual piezoelectric elements 3 is made using high pass frequency filter fixtures 2a–2c. Also, the distance between the radiation sources 9a–9c, such as ion guns, and the piezoelectric element 3 of each stage 31a–31c can be adjusted by control means including control devices such as drive mechanisms 14a–14c respectively, to change the processing rate. Furthermore, the frequency difference Δf between the frequency f1 of the work and the desired frequency f0 can be processed by an external calculation device 15 such as a computer connected to each of the individual stages. In order for an optimal processing rate of each stage to be achieved, a control signal is sent to an individual drive mechanisms 14a–14c through electrical lead 101, and following each stage the distance between the piezoelectric element 3 and the radiation sources 9a–9c can be changed. As a result, with each of the stages, the resonance frequency f1 of the work 3 can be easily and reliably stably adjusted in order to achieve the target resonance frequency. Furthermore, the processing apparatus 30 is designed to prevent any mistakes which might be caused by excessive radiation at high processing rates.

Figure 2:
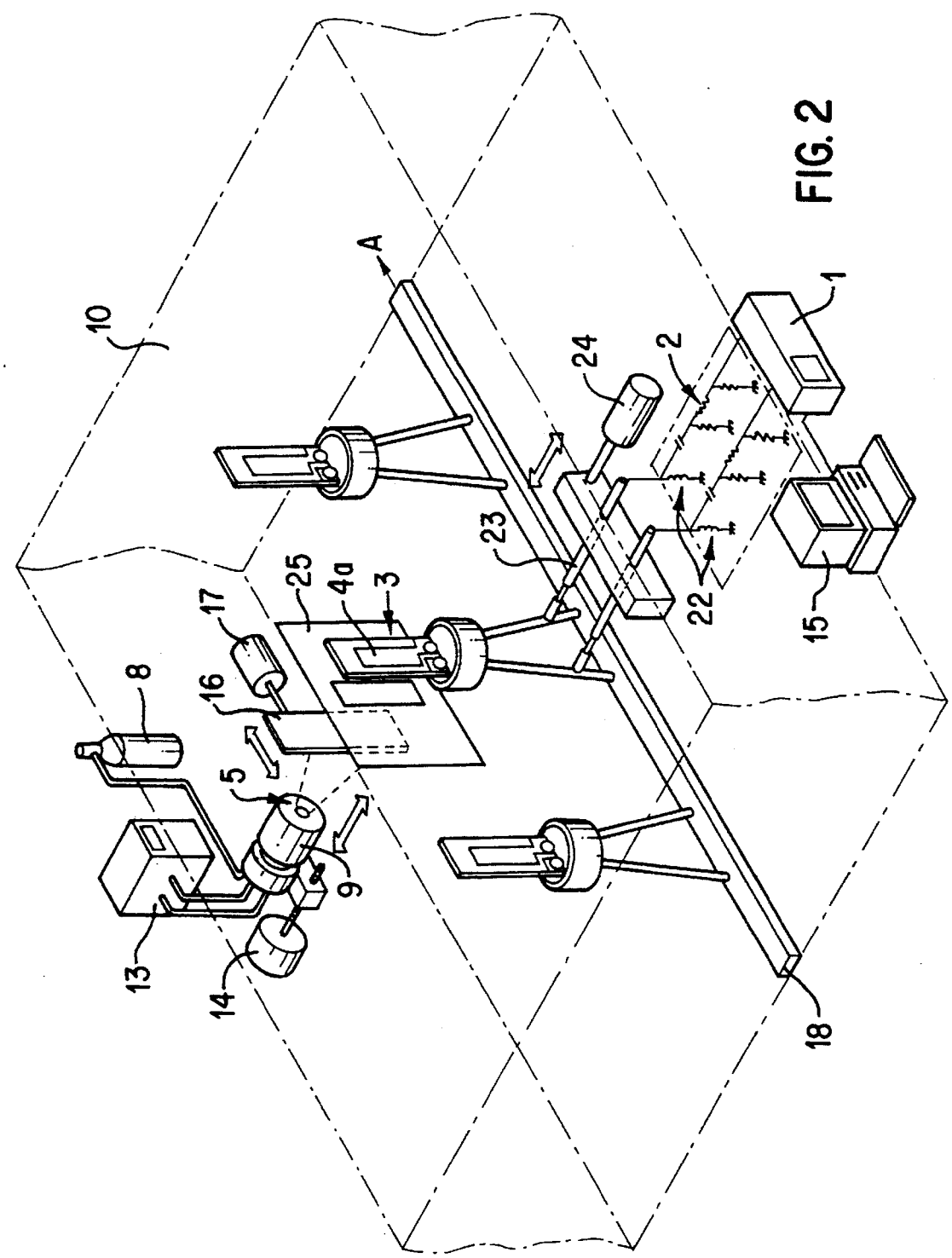
FIG. 2 is an oblique view that shows the construction of portions of the processing device of FIG. 1 including a first embodiment of a high pass frequency filter fixture.

FIG. 2 shows the construction of the processing apparatus with the central stage shown in detail. The construction of the stages 31a–31c are the same except for the distance between the workpiece and the ion gun and the radiating energy of the ion gun.

Alternatively, a single ion gun with a single stage and a single drive mechanism may be used with rough, intermediate, and fine frequency adjustment being made by gradually increasing the distance between the ion gun and the resonant element.

Therefore, in the following, identical elements in multiple stages, if multiple stages are used, will be discussed without their alphabetical suffixes, as illustrated in FIG. 2.

Figure 3:
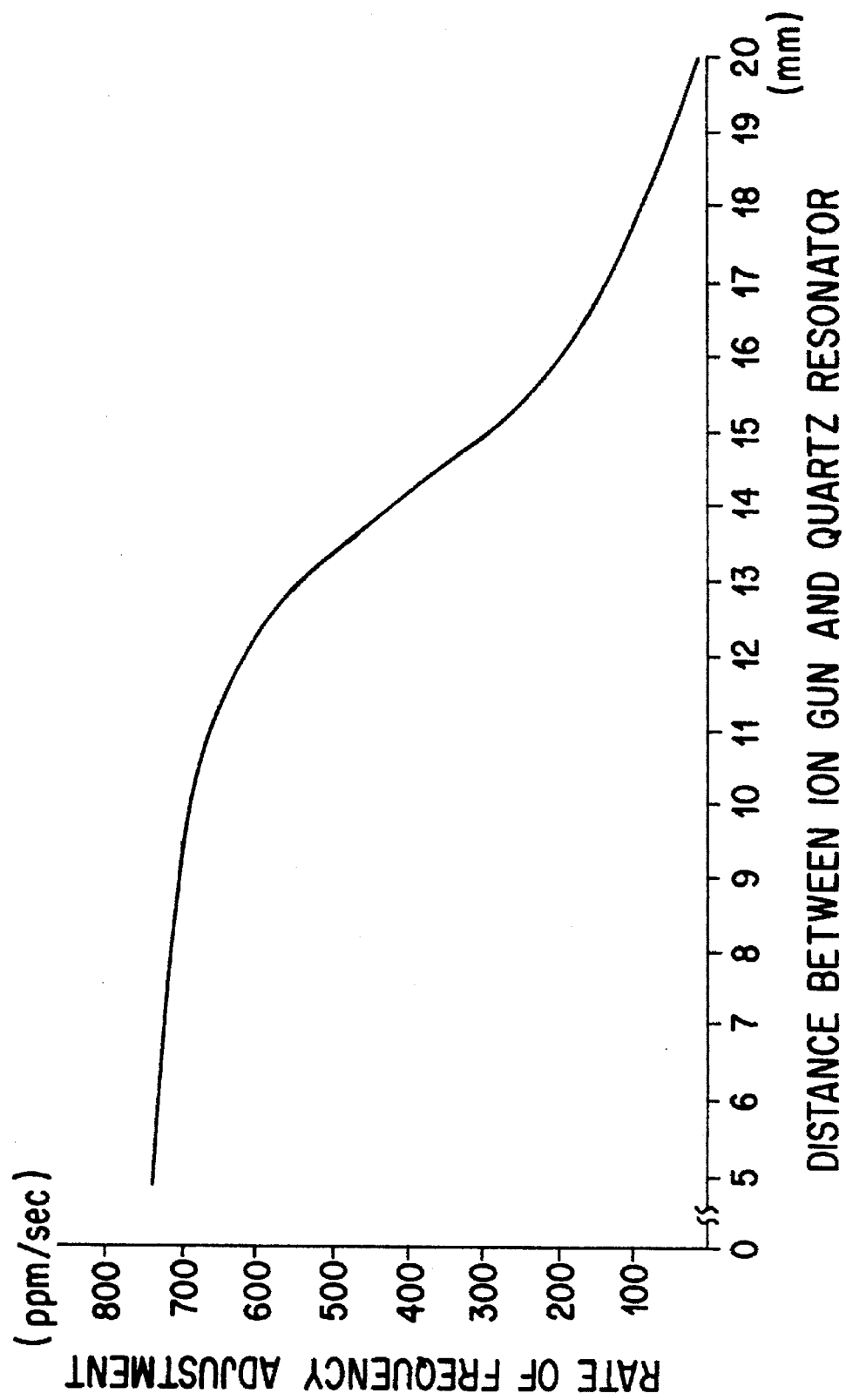
FIG. 3 is a graph that shows the frequency adjustment rate in terms of material removal versus the distance between an ion gun and a quartz resonator.

FIG. 3 shows a graph of the variation in the rate of frequency adjustment in terms of material removal per second versus the distance between an ion gun and a quartz resonator. The graph indicates how a single stage may be used to provide rough, intermediate, and fine frequency adjustment by adequately varying the distance between a radiation source and a resonant element. In a single stage arrangement, an electrical lead, like electrical lead 101 of FIG. 1, connects the external calculation device 15 such as a computer to the single drive mechanism to provide electrical communication to control the distance adjustment between the ion gun and the resonant element based on the resonance frequency measured by the frequency measurement system.

The frequency adjustment stage which is established within the vacuum chamber 10, i.e., the ion gun 9 of the present embodiment, comprises the radiation source for frequency adjustment. The ion gun 9 for example is provided with a stainless electrode rod of 10 millimeters in diameter connected to a direct current electric source 13 and a stainless cylindrical housing of 100 millimeters in diameter on the external side of the electrode rod. Furthermore, an earth shield is provided on the cylindrical housing. As indicated above, the vacuum chamber 10 is evacuated to $10^{-3}$ Torr level, following which it is filled with argon gas to a state of $10^{-1}$–$10^{-2}$ Torr, and upon the impression of the direct current voltage from the direct current electric source 13 to the electrode rod of the ion gun 9, argon plasma is produced between the earth shielded external periphery and the electrode rod. By means of the produced plasma, the argon gas is formed into ions, the ionized argon gas being propelled from the nozzle outlet opening 5 of 3 millimeter in diameter in front of the tip of the electrode rod.

The piezoelectric element 3 is conveyed by the transport mechanism 18 to a position aligned with ion gun 9 and facing the nozzle outlet opening 5. The gas ions collide with the surface of the piezoelectric element 3 of the quartz resonator. Through the collision of the argon ions on the piezoelectric element 3, the electrode film 4 which is formed of silver on the surface of the work 3 is reduced by the ejection of silver from the electrode surface. In the present example, electrode films 4a and 4b are formed on opposite surfaces of the piezoelectric element 3, the argon ions radiating onto the surface of the electrode 4b opposite side 4a of the electrode membrane shown in FIG. 2. By the reduction of the mass of the electrode, the resonance frequency f1 of the piezoelectric element 3 is changed from a lower frequency to a higher frequency.

In FIG. 2, a shutter 16 between the ion gun 9 and the piezoelectric element 3 is controlled to open or close by a drive mechanism 17, enabling the interruption of the radiation of the argon ions. In FIG. 1, three shutters 16a–16c and corresponding drive mechanisms 17a–17c are illustrated. With regard to FIG. 2, a mask 25 is inserted between the shutter 16 and the piezoelectric element 3 to regulate the directionality of the argon ions. The mask 25 which is used in the processing device limits radiation of the argon ions to the desired piezoelectric element 3. Furthermore, it is unnecessary that the mask used in the process be one of high precision. In addition, precise positioning of the piezoelectric element 3 relative to the mask 25 is not required.

In addition, a drive mechanism 14 is established to move the ion gun 9 to the front or rear relative to the piezoelectric element 3. By changing the distance between the ion gun 9 and the piezoelectric element, the energy of the argon ions which are radiated onto the piezoelectric element can be controlled. The further the radiation source is from the piezoelectric element 3, the less the total energy of the particles reaching the electrode and the more slowly material is removed from the surface of the electrode. Therefore, the farther the radiation source is from the piezoelectric element 3, the finer and slower the adjustment of the resonance frequency.

By thus changing the distance, and controlling the energy of the argon ions, the ion gun 9 can be maintained in a stable condition wherein a specified amount of electric power can be impressed, as a consequence of which stable performance and processing rate can be obtained. Because of this, control of the processing rate can be easily accomplished, and substantial changes in resonance frequency can be accomplished quickly. In addition, there is also good response at low rates in which minute adjustments are accomplished.

Through the collisions of the argon ions, the frequency f1 of the piezoelectric element 3 is changed, and through the fixture 2, continuous measurement can be accomplished through the use of a frequency measurement means such as a network analyzer 1. In FIG. 1, three network analyzers 1a–1c are illustrated. With regard to FIG. 2, in connecting the network analyzer 1 with the fixture 2, a 50 ohm coaxial cable is used. The connection of the fixture 2 and the piezoelectric element 3 is accomplished through connection means including a removable probe 23 moved by means of a drive mechanism 24 relative to the lead which is connected to the piezoelectric element 3. Measurement of the resonance frequency is accomplished during the radiation of the continuously transported piezoelectric element 3.

Figure 4:
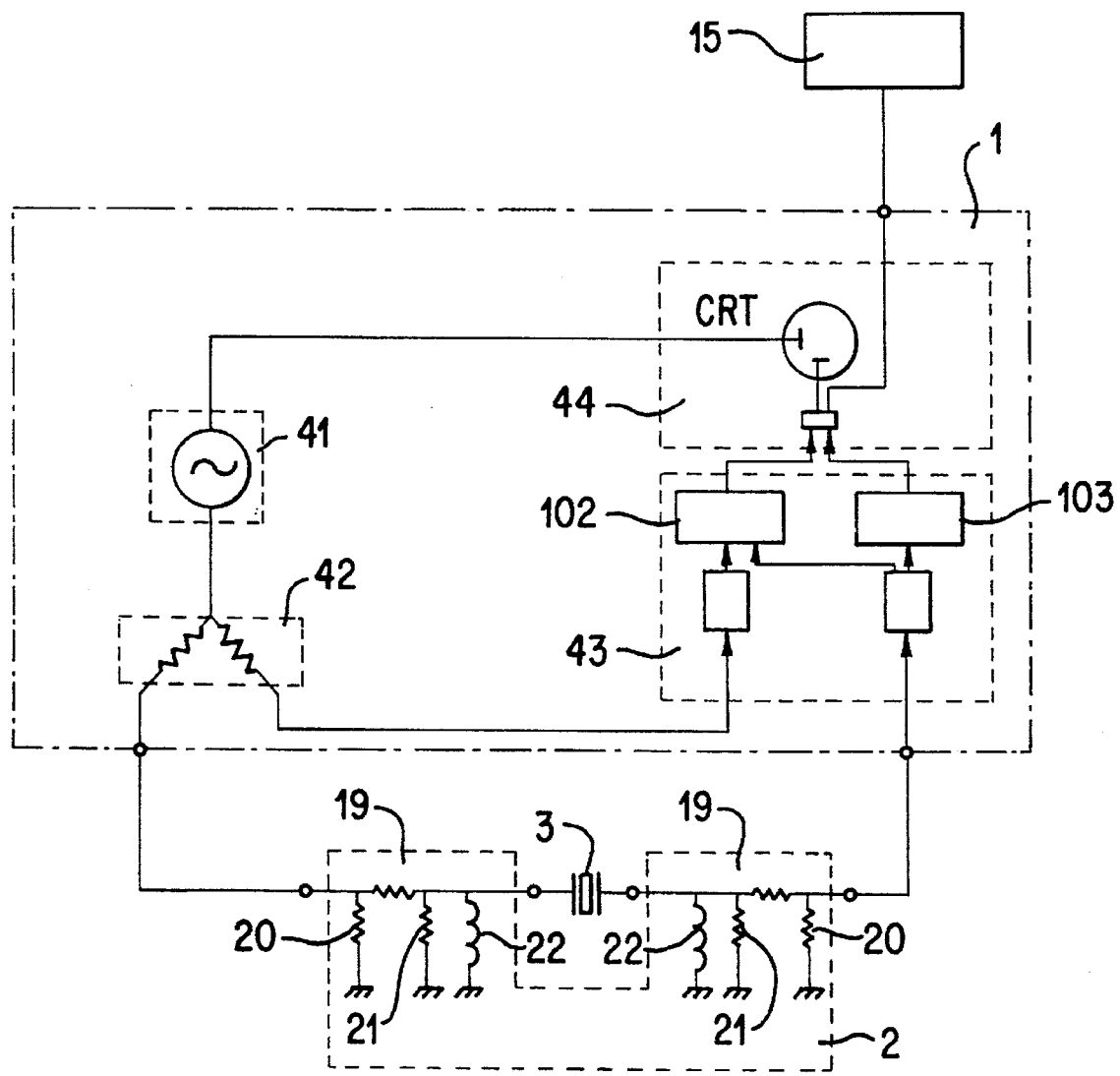
FIG. 4 is a block diagram that shows a first embodiment of a frequency measurement system including a second embodiment of a high pass frequency filter fixture for the processing device of FIG. 1.

In FIG. 4, a construction of the frequency measurement means, a measurement system, of the present invention is shown. In the circuit construction (impedance matching circuit) of the fixture 2 of the measurement system of FIG. 4, resistors 19, 20 and 21 are respectively attached to the electrodes 4a and 4b in standard π circuits. Furthermore, the electrical coils 22 are connected in parallel to the resistors 21 between the electrode 4a, 4b and the standard π circuit. These electrical coils 22 are connected to the circuits to provide a short circuit between the electrodes 4a and 4b of the piezoelectric element 3 and the ground. Therefore, the positive charge on the electrodes 4a and 4b caused by the radiation flow to the ground through the probe 23 and the electrical coils 22 as direct current components, or low frequency components, and do not flow to the network analyzer side. Furthermore, only the alternating current components originating in the resonance frequencies flow into the network analyzer 1. Because of this, even if a current of a large low frequency component flows into the piezoelectric element 3 due the radiation, that low frequency component will not flow into the network analyzer side to interfere with the resonance frequency measurement. Hence, even during the radiation process, there can be continuous monitoring of the resonance frequency.

In FIGS. 5-8, third, first, fourth and fifth embodiments of circuits of high pass frequency filter fixtures are shown. In the third embodiment of FIG. 5, the circuit is composed of an electrical coil 22 which bypasses the low frequency components, and a resistor 21 connected in parallel for impedance adjustment. Resistor 21 has a resistance which is higher than the impedance of electrical coil 22 for the low frequency components flowing to the electrical coil 22, so that only the high frequency components are supplied to the network analyzer side.

Figure 6:
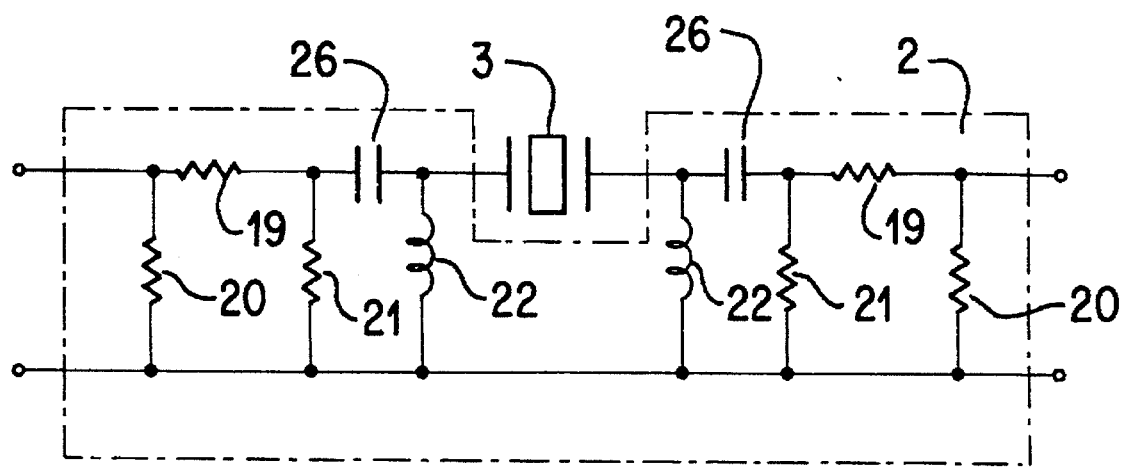
FIG. 6 is a circuit diagram that shows the first embodiment of a high pass frequency filter fixture for a frequency measuring system, also illustrated in FIG. 2.

The first embodiment shown in FIG. 2 and FIG. 6 is a circuit in which a load capacitor 26 has been added to the electrical coil 22 and the standard π circuit. The capacitor which the users utilize in an oscillation circuit or a frequency measurement system can be selected for this load capacitor 26 by the manufacturers. As a result, the manufacturers can measure the resonance frequency by the condition of the users' oscillation circuit or frequency measurement system. This load capacitor 26 also functions as a filter which permits to pass only of the high frequency components to the network analyzer side. Consequently, it also has the function of passing the low frequency components to the ground side without any direct flow to the network analyzer side in cooperation with the coil 22.

Figure 5:
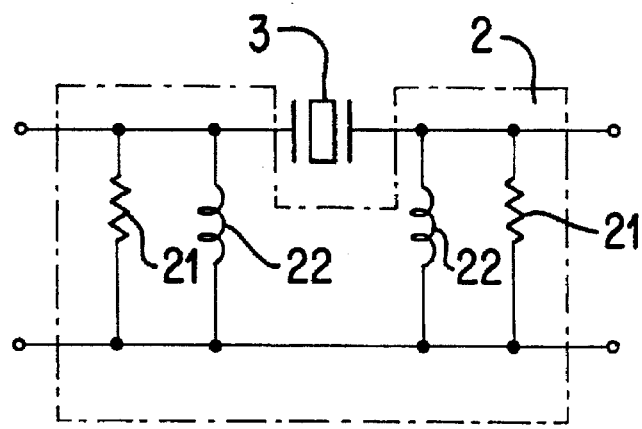
FIG. 5 is a circuit diagram that shows a third embodiment of a high pass frequency filter fixture for a frequency measuring system.
Figure 7:
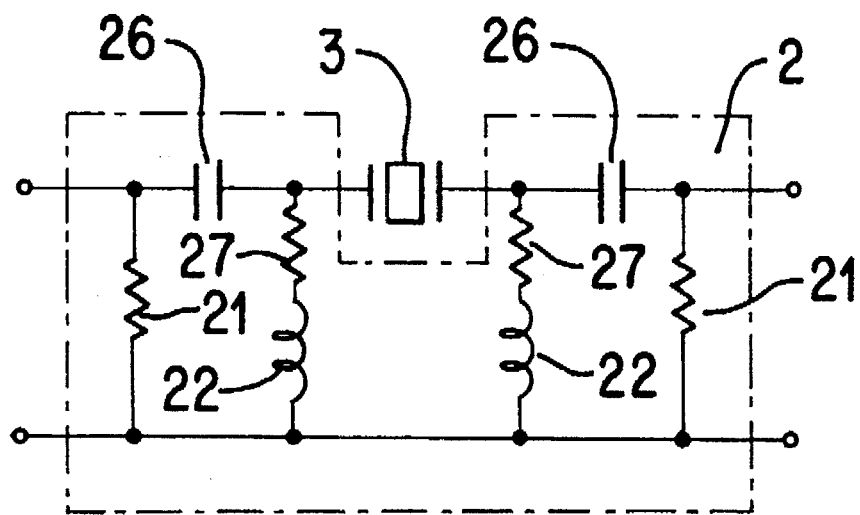
FIG. 7 is a circuit diagram that shows a fourth embodiment of a high pass frequency filter fixture for a frequency measuring system.
Figure 8:
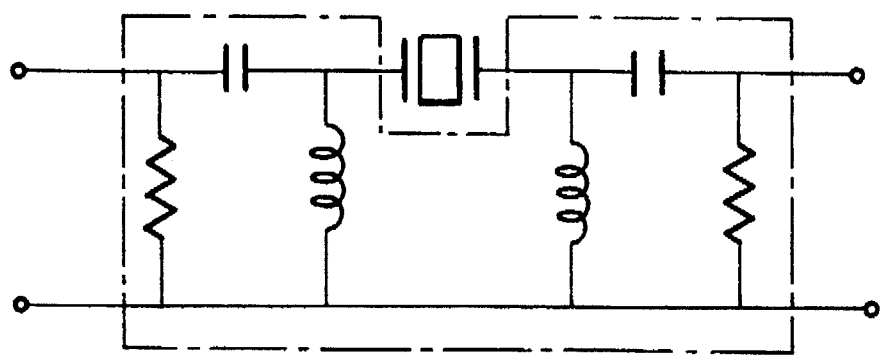
FIG. 8 is a circuit diagram that shows a fifth embodiment of a high pass frequency filter fixture for a frequency measuring system.

It is also possible for a load to be applied to the simple type of matching circuit shown in the third embodiment of FIG. 5. The embodiment shown in FIG. 7 shows the addition of the load capacitor 26 to the simple type of matching circuit shown in FIG. 5, and shows the further serial connection of resistor 27 to electrical coil 22. By serially connecting resistor 27 to electrical coil 22, the electric current flowing through electrical coil 22 can be restricted. At the time the radiation commences, there is a sudden great direct flow of electric current through the electrode. However, through the insertion of the resistor 27, the value of the imposed electric current can be restricted, making it possible to regulate the electric current flowing through the piezoelectric element. Alternatively, the resistor may be deleted as shown in the fifth embodiment of FIG. 8.

As the circuit composing the fixture 2, adaptation may be made of any of these types of circuits. However it would be well in selecting the most appropriate circuit to consider the shape and type of the piezoelectric element and radiation conditions, as well as other essential elements.

Returning to FIG. 4, a summary explanation is provided of the network analyzer 1 which is adopted for the purpose of monitoring the resonance frequency in accordance with the present embodiment. The network analyzer 1 is endowed with a high frequency production source 41, the produced high frequency signals being divided into two components by the signal divider 42, one component of which passes through the input side of the fixture 2 being impressed on one of the electrodes of the piezoelectric element 3. The other of the electrodes of the piezoelectric element 3 is input through the output side of the fixture 2 to the receiver 43 of the network analyzer 1, the remaining signal separated by the signal divider 42 being simultaneously input into the receiver 43. Also, the phase as well as the amplitude ratio of the high frequency signal are obtained by elements 102 and 103 respectively of the receiver 43 and they are displayed in the display 44 and the frequency can be monitored while the resonance frequency is adjusted. At the same time, this data is supplied to the external calculation device 15, and the initial resonance frequency f1 is compared with the predetermined target resonance frequency f0, or with the target resonance frequencies f0", f0' with regard to first and second stages respectively when plural stages are used.

By means of the external calculation device 15, and on the basis of these comparisons, calculation is accomplished of the optimum processing rate for processing the piezoelectric element for each of the stages. Furthermore, in order to obtain the calculated processing rate, calculations are accomplished by the distance between the piezoelectric element 3 and the nozzle outlet opening 5 of the ion gun 9, a signal then being sent from the electrical calculation device 15 to the drive mechanism 14 via electrical connection 101. As a result, the frequency adjustment source 9 is moved forward or backward, optimally adjusting the distance between the nozzle outlet opening 5 and the piezoelectric element 3.

Figure 9:
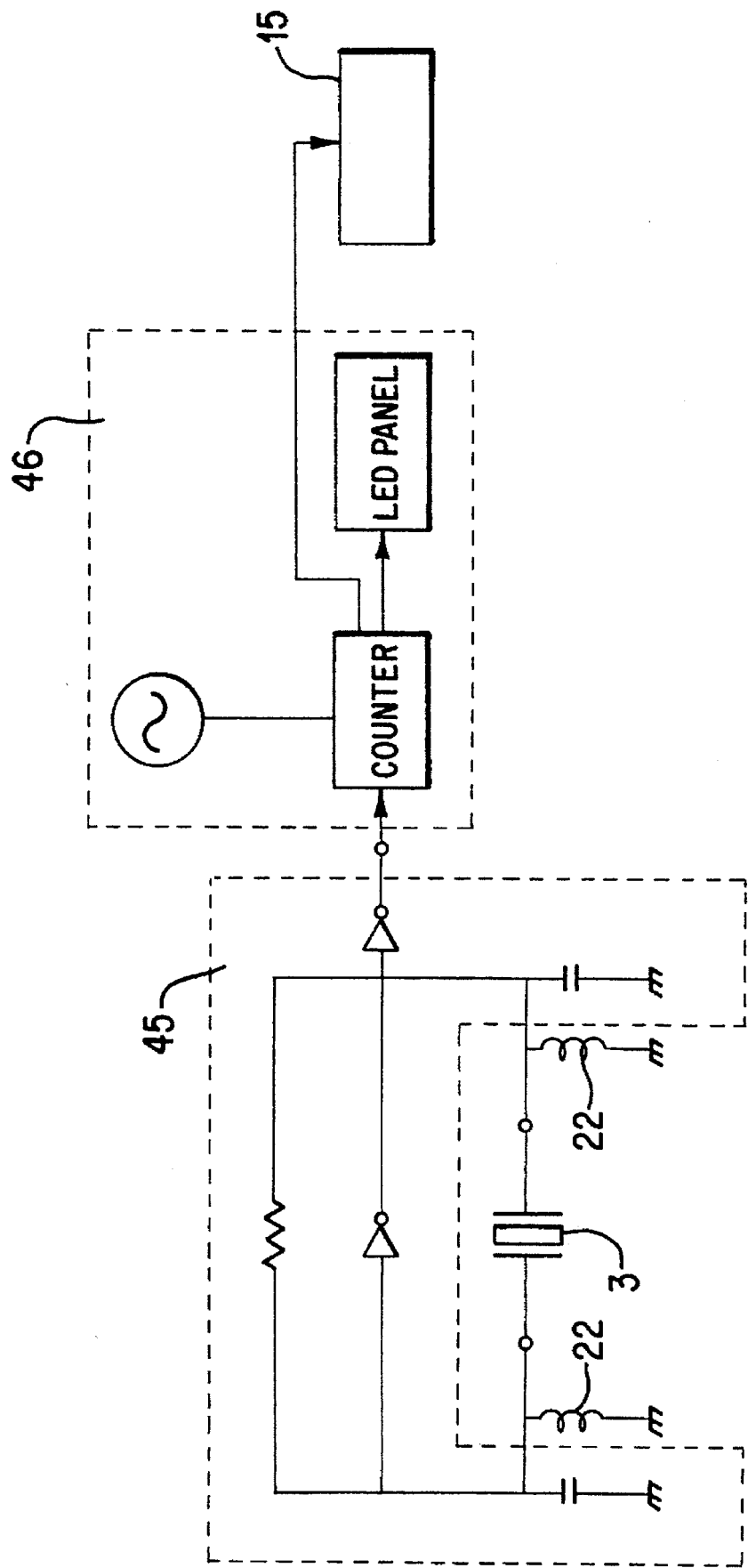
FIG. 9 is a diagram that shows a second embodiment of a frequency measurement system for the processing device of FIG. 1.

In lieu of the network analyzer, as shown in FIG. 9, an oscillator 45 and a frequency counter 46 can be used to monitor the resonance frequency f1 of the piezoelectric element 3 during radiation. By supplying the output of the frequency counter 45 to the external calculator processor 15, it is possible to control the processing rate in the same manner as the measurement system of FIG. 4.

Using the resonance frequency f1 which is monitored by these devices, the distance between the piezoelectric element 3 of each stage and the nozzle outlet opening 5 can be adjusted by drive mechanism 14. The distance may be varied from 5 to 20 mm for each stage 31a-31c if multiple stages are used. The distance is preset to 5 mm prior to the commencement of the frequency adjustment process. Once processing has commenced, the ion gun 9 can be controlled on the basis of measured frequency differences, differences in programmed frequencies, and the established values for the processing rate. The ion gun which radiates the ions is moved gradually towards the rear during the frequency adjustment process to change the processing rate from a fast rate to a slow rate. During this period, the electric power supplied to the ion gun 9 is maintained in a fixed manner, thereby assuring stable radiation capability. Furthermore, calculations of the processing rate and adjustments are easily accomplished, thereby accomplishing frequency adjustment with a high level of accuracy. Furthermore, continuous processing eliminates problems associated with the intermittent stoppage of radiation, or excessive radiation whereby the frequency might exceed the frequency of f0, making it impossible to accomplish regulation. In addition, once the monitored resonance frequency f0 of the work 3 achieves the target frequency for each stage, the plasma can be cut off, and the piezoelectric element 3 can be moved to the next stage by means of the transport mechanism 18.

The commencement of radiation of the argon ions and their cutoff may also be controlled by turning on and off the direct connection of direct current of the electric source 13. Alternatively, the plasma may be continuously produced, and the shutter 16 can be controlled to open or close by means of the shutter drive mechanism 17. In accomplishing the stable radiation by means of the ion gun, it is desirable for the ion gun to operate in a fixed condition. To achieve that efficiently, a shutter 16 which may be opened or closed is used. In using the shutter 16, when in the closed position, the processing device according to the present invention can assure a sufficient distance between the ion gun 9 and the piezoelectric element 3, and the processing rate is in a reduced state. Furthermore, in terms of the response relative to the shutter speed or control, there is not a particular need for a very fast shutter speed. Therefore, approved reliable well-known shutter mechanisms may be used. By using three stages, the processing speed for the final adjustment can be lowered, and a severe requirement may not be needed for a shutter and control mechanism.

Figure 10:
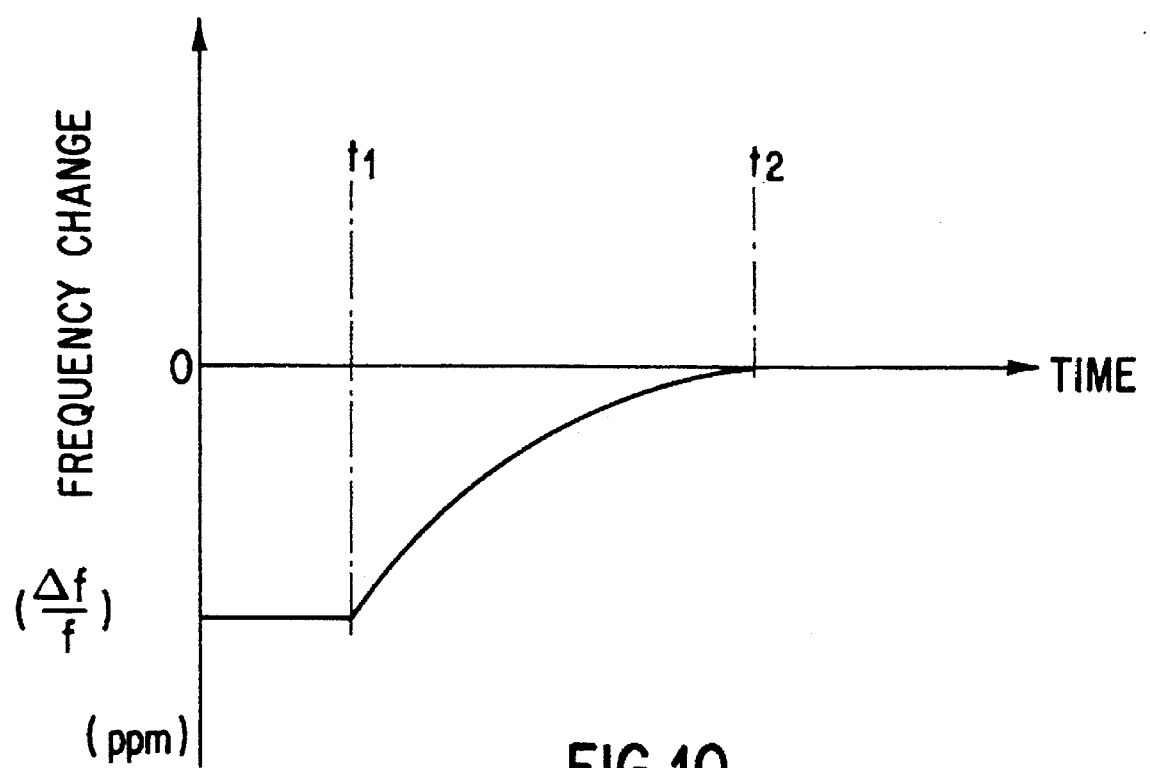
FIG. 10 is a graph that shows the change in the resonance frequency of a piezoelectric element with processing time using the processing device of FIG. 1.

FIG. 10 shows the changed frequency of a piezoelectric element during frequency adjustment using a device according to the present embodiment. Once radiation commences at the time t1, argon ions are radiated onto the electrode from the nozzle outlet opening 5 positioned in the vicinity of a piezoelectric element 3, resulting in a sudden increase in the resonance frequency. Subsequently, continuing the process, the distance between the nozzle outlet opening 5 and a piezoelectric element 3 is gradually increased, controlling the amount of frequency change in the piezoelectric element 3, and gradually bringing the frequency closer to the desired target resonance frequency. In each stage, whether a single stage or multiple stages are used by lengthening the distance between the ion gun 9 and the piezoelectric element 3 in the vicinity of the target resonance frequency, a slower processing rate can be achieved for finer adjustment. At the time t2, if the measured resonance frequency approximately reaches the target frequency, then radiation is stopped.

Figure 11:
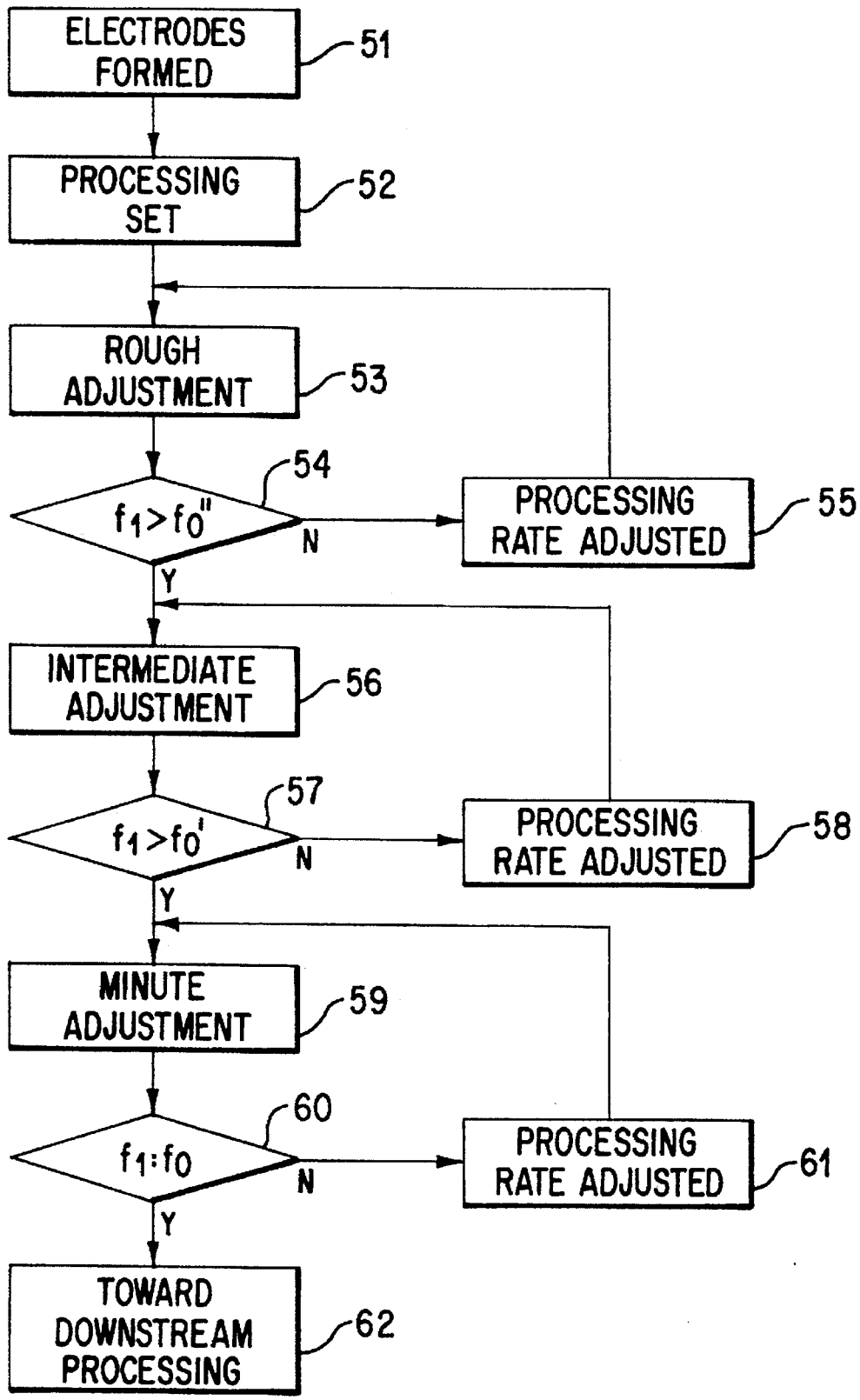
FIG. 11 is a flowchart that shows a manufacturing process of the present invention.

FIG. 11 shows a summary flowchart of the manufacturing process of a piezoelectric element according to the present invention. First of all, in step 51, electrodes are formed through the deposition of a metallic substance on the surface of the piezoelectric element by any methods including conventional methods. Next, in step 52, the piezoelectric element on which an electrode has been formed is set in the processing apparatus of the present invention. Also, in step 53, the piezoelectric element is introduced to the first stage, where radiation is begun to achieve rough adjustment. During the course of this process, the frequency f1 of the work is monitored in step 54, radiation continuing until the target resonance frequency f0" of the stage is attained. At this time, on the basis of the resonance frequency monitored in step 55, the distance between the piezoelectric element and the ion gun is adjusted in order to obtain the optimum processing rate.

In step 54, once the monitored frequency f1 reaches the target frequency f0", the piezoelectric element 3 is moved to the second stage by means of the transport or conveyance mechanism 18. In step 56, radiation is used for intermediate or medium adjustment. At this stage, in step 57, the frequency f1 is monitored, and a comparison is made with the target frequency f0'. In step 58, radiation continues while adjusting the processing rate, until the target frequency f0' is attained.

In step 57, if it is determined that the target frequency f0' has been attained, then the piezoelectric element 3 is transported to the third stage, radiation being used for fine adjustment in step 60. In step 61, the resonance frequency f1 is monitored, and radiation is continued while adjustment takes place of the processing rate in step 62, until finally reaching the desired final resonance frequency f0. Once the desired final resonance frequency and the monitored resonance frequency are the same, the processed element is removed from the vacuum chamber 10. Also, the piezoelectric element in which the resonance frequency has been precisely adjusted can be supplied to downstream processing for use with a surface mounted device and so on for final marketing.

In this type of production process, depending on the characteristics of the individual piezoelectric elements, the processing conditions are adjusted by monitoring the resonance frequency. Furthermore, the piezoelectric elements obtained by means of these processes have the extremely precisely defined resonance frequencies desired. Furthermore, there is a very small variation from the exact resonance frequency desired in the resonance frequency established, eliminating unsatisfactory produced elements, and enabling efficient production. In this manner, through the use of a production method and processing apparatus in accordance with the present invention, actual application may be made of a frequency adjustment method which utilizes plasma, thereby offering a high performance piezoelectric element which can be produced in a short time, and at low cost.

Figure 12A:
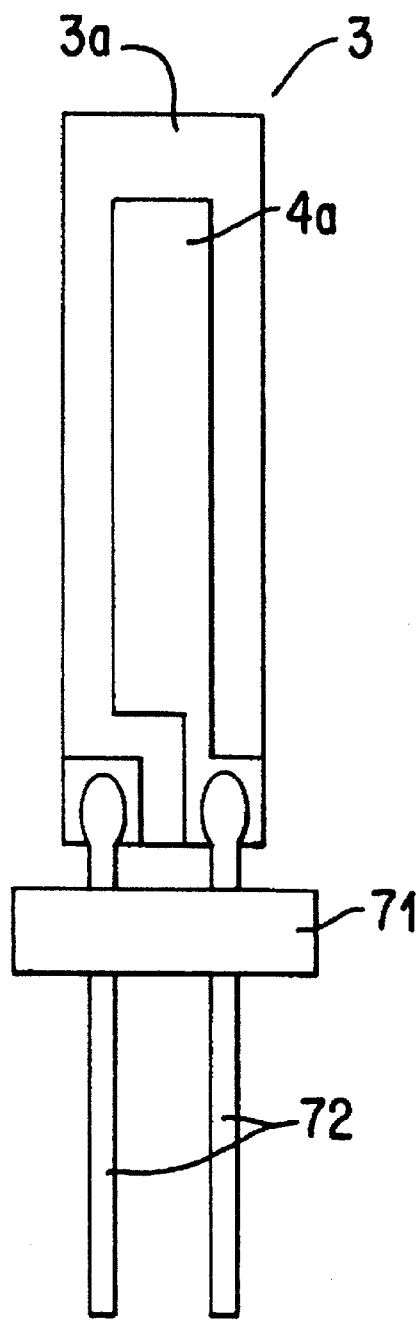
FIG. 12(a) and FIG. 12(b) are front and side views respectively of a quartz resonator in which the frequency has been adjusted by the processing device shown in FIG. 1.
Figure 12B:
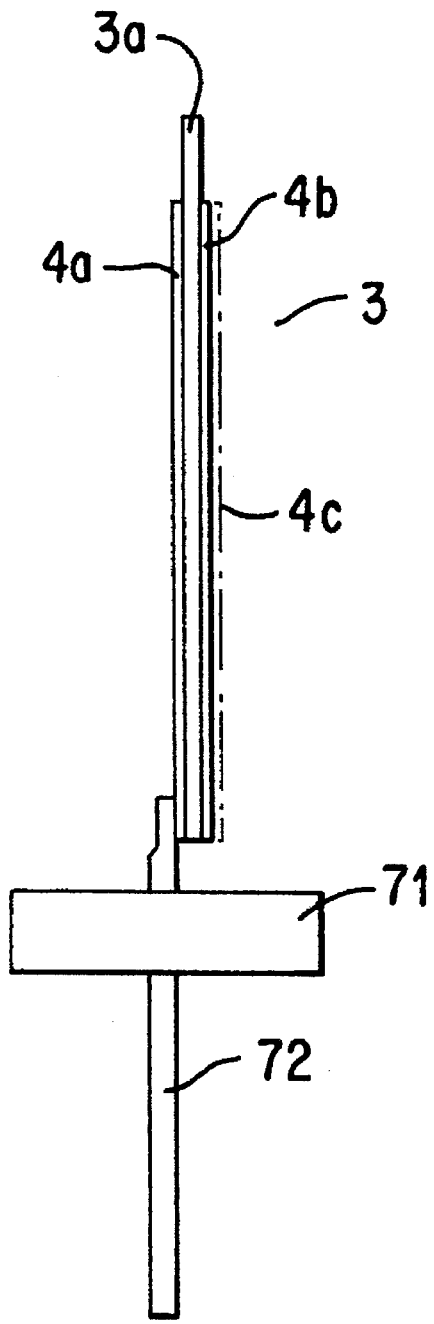

FIG. 12(a) and 12(b) show an embodiment of a piezoelectric element 3 in which the frequency has been adjusted by means of the processing apparatus according to the present embodiment. The piezoelectric element 3 shown in FIG. 12(a) and FIG. 12(b) uses a rectangular shaped AT cut quartz resonator as the piezoelectric form 3a, on which silver is deposited on both surfaces, thereby forming the two electrodes 4a and 4b, and includes a base 71 and leads 72. Also, through the radiation of argon ions onto the electrode 4b, the thickness has been reduced from that shown by the dotted line 4c. The rate for reducing the thickness changes depending upon the energy produced by the bombardments of the radiated ions on the electrode. Furthermore, with the described processing device, in each of the respective three steps and stages, the distance is predetermined between the workpiece and the ion gun in order to obtain the optimum energy for accomplishing rough adjustment, intermediate adjustment, and minute adjustment, with fine tuning being accomplished by adjusting the distance through forward and rearward movement by drive mechanism 14.

As discussed previously, it is possible to use a single ion gun for rough, intermediate and minute adjustment. In such a case, two drive mechanisms may be used, one for accomplishing the rough adjustment of the distance in order to achieve the optimum processing energy, and one for adjusting the distance forwardly and rearwardly for minute adjustment to achieve frequency adjustment in one stage. Furthermore, the adjustment of the distance is not limited to the ion gun, but may also be accomplished through the movement of the piezoelectric element, or through the movement of both the ion gun and the piezoelectric element.

Also, in addition to adjusting the distance between the work and the ion gun, adjustment can also be made of the ion current flowing to the work from the ion gun, to the floating electric potential impressed on the ion gun, or adjustment can be made to both, in order to adjust the energy of bombardment on the piezoelectric element. In addition, it is also possible to vary the type of ionized gas, and using a magnetic field or the like, it is possible to change the effective distance. Furthermore, by changing the surface area of the mask, the amount of radiation reaching the electrode can be controlled to adjust the rate of reducing the thickness of the electrode. Such uses may be made of various stages, and no matter which of the stages is used, such uses fall within the present invention.

Furthermore, with the processing device described above, of the two electrodes 4a and 4b, only one of the electrodes has the thickness reduced. In lieu of this, a facing ion gun may be attached, and the thickness of both of the electrodes may also be reduced. In addition, the invention is not limited to an AT cut quartz resonator, but elements may also be used such as a tuning fork resonator, or a piezoelectric ceramic resonator, etc. If use is made of an element in which the frequency is adjusted by adjusting the thickness of the electrode, then it naturally falls within the present invention.

Furthermore, in the described processing apparatus, multiple workpieces can be arranged in parallel and transported consecutively to the three stages. The stages can be radially arranged, and the workpieces can be transported to each stages, and each of the steps being accomplished relative to rough adjustment, intermediate adjustment, and minute adjustment. The arrangement of the multiple stages for accomplishing frequency adjustment may be arranged while considering the layout of the production process, as well as the characteristics of the produced elements. Furthermore, by means of the processing apparatus, division may be accomplished into the three stages comprised of rough adjustment, intermediate adjustment, and minute adjustment, and the frequency adjustment performed. However, the number of stages may range from 1 to 4 or more steps, being established with consideration to the performance of the ion gun, and/or the characteristics of the workpiece. In addition, the same results can be achieved by utilizing the electrode of the workpiece for another electrode which generates the plasma in a sputter-etching apparatus.

FIG. 13(a) shows the aging characteristics at 85° C. for 26 MHz AT cut quartz resonator of the fundamental vibrational mode wherein the frequency is adjusted by means of processing method using the plasma in the present invention, and FIG. 13(b) shows the aging characteristics of the same type of AT cut quartz resonator wherein the frequency is adjusted by means of deposition according to the prior art. As FIG. 13(b) shows, with a quartz resonator in which frequency adjustment has been accomplished by means of deposition, frequency changes were manifest at 100 hours, and over the course of 1000 hours, frequency changes were apparent in excess of 2 ppm. In contrast, as FIG. 13(a) illustrates, using the plasma in accordance with the present invention, with a quartz resonator at 100 hours there was no frequency change, and even at 1000 hours, a frequency change only one third that of the resonator adjusted by means of deposition. In addition, FIGS. 13(a) and 13(b) show the frequency variations in the statistical range of 3 σ following the passage of the specified amounts of time. As FIGS. 13(a) and 13(b) show, the manufacturing method of the present invention produces a frequency adjusted AT cut quartz resonator with less variations in resonance frequency, even after 1000 hours. In this manner, a quartz resonator on which frequency adjustment has been accomplished by reducing the thickness of the electrode in accordance with the present invention has extremely stable performance with high durability in comparison with a quartz resonator on which frequency adjustment has been accomplished by depositing the metal on the electrode.

By means of the manufacturing method and processing apparatus according to the present invention, through the use of a plasma, a piezoelectric element is produced in which the resonance frequency has been adjusted extremely precisely, with small variations in the final resonance frequency. Furthermore, the aging characteristics are judged to also be very good.

Figure 14:
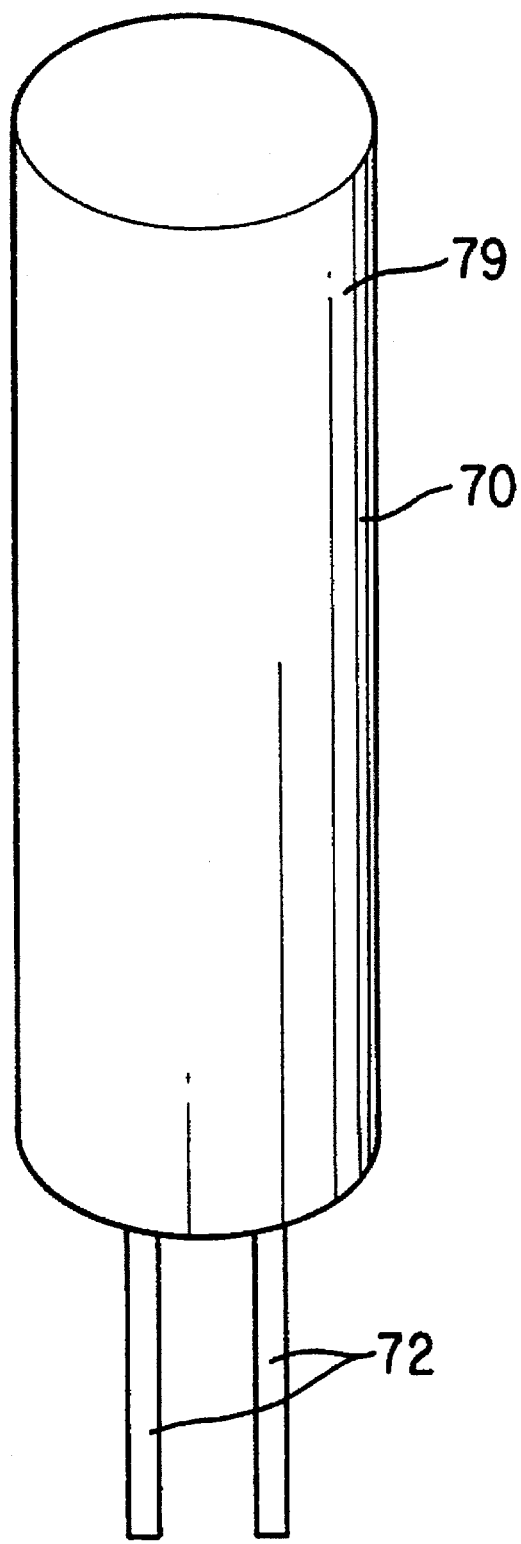
FIG. 14 is an oblique view of an quartz resonator unit in which a quartz resonator as shown in FIG. 12(a) and FIG. 12(b), is sealed.
Figure 15:
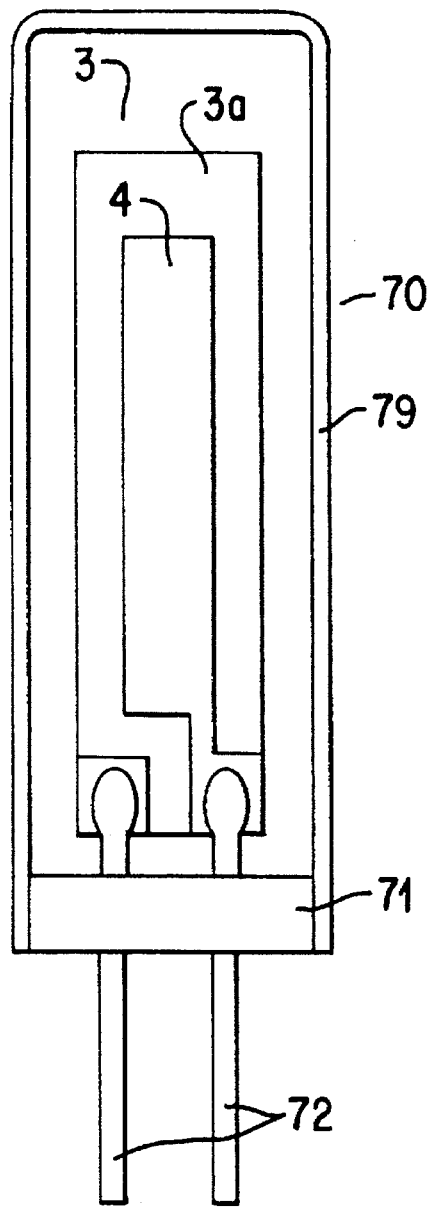
FIG. 15 is a cross-sectional view of the quartz resonator unit shown in FIG. 14, exposing a front surface of a quartz resonator.
Figure 16:
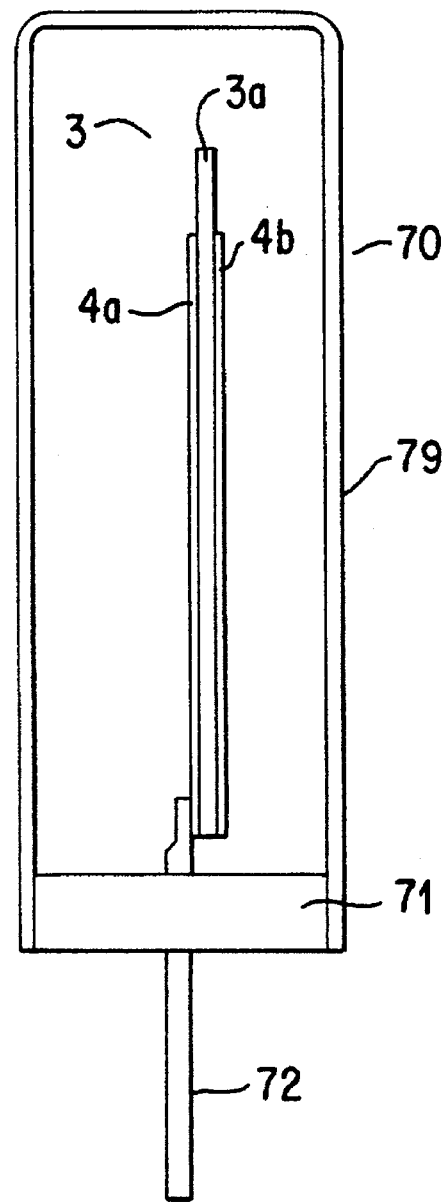
FIG. 16 is a cross-sectional view of the quartz resonator unit shown in FIG. 14, exposing a side surface of the quartz resonator.

FIG. 14 shows a quartz resonator unit in which the frequency adjusted quartz resonator is sealed. FIGS. 15 and 16 show cross-sections of this quartz resonator unit. The quartz resonator unit 70 of the present embodiment has a cylindrical shaped case 79, the diameter of which is 2.0±0.2 mm, and the length of which is about 6.0±0.5 mm. The quartz resonator 3 is sealed within this case 79 with leads 72 connected to each of the electrodes 4a and 4b. Leads 72 are conducted to the outside of the case 79 through base 71, electric power being supplied to the quartz resonator 3 through the leads 72, in order to excite oscillation.

Figure 17:
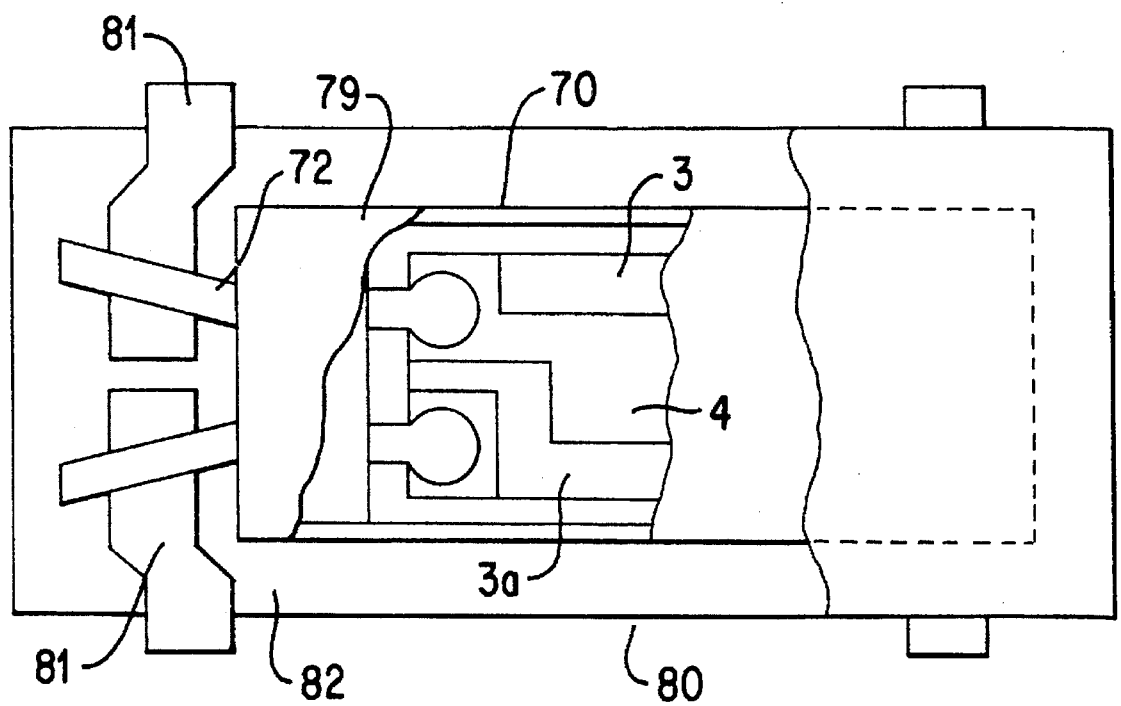
FIG. 17 is a cutaway view of an quartz resonator device of the molded SMD type with the quartz resonator unit shown in FIG. 14.

FIG. 17 shows a surface mounted quartz resonator device 80, which is molded by means of a resin encapsulating the quartz resonator unit 70. Leads 72 which project from the cylindrical case 79 of the quartz resonator unit 70 are welded to the metallic leads 81 outside the resin mount 82. The case 79 is molded by means of the resin 82, owing to which the unit can be mounted on the surface of the circuit board.

Figure 18:
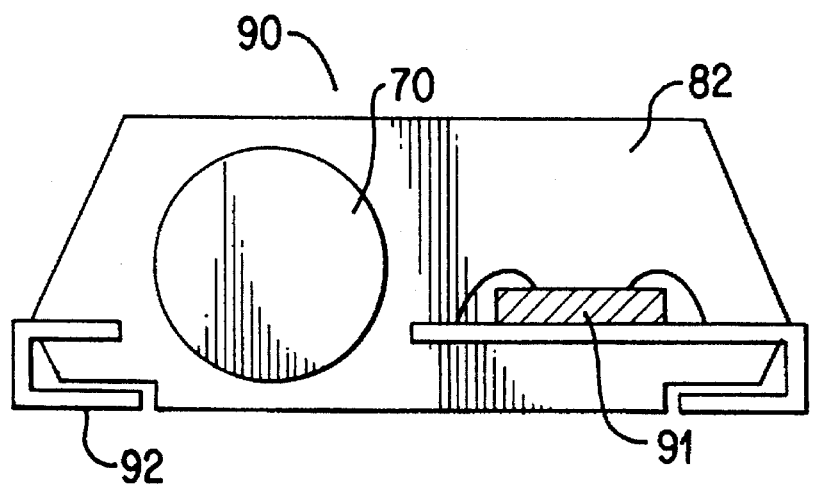
FIG. 18 is a cross-sectional view of a quartz oscillator which packages the IC and the quartz resonator unit shown in FIG. 14.

FIG. 18 shows a quartz oscillator 90, which includes a quartz resonator unit 70 and an integrated circuit 91, molded by resin. The integrated circuit includes at least an oscillation circuit which oscillates the quartz resonator unit 70. The quartz resonator unit 70 and the integrated circuit 91 are positioned on the metal frame 92, and they are molded by resin 82.

Also, by mounting the quartz oscillator 90 on a circuit board, a regulated frequency for operating each of the mounted circuits can be supplied. Since the diameter of the quartz resonator unit 70 can extend as little as 2 to 3 mm, and the thickness of the oscillator can be held from 2.5 to 3.7 mm, the device can be kept small. Furthermore, through the use of the quartz resonator unit of the present embodiment, high frequencies can be stably supplied with the high degree of reliability, so that an oscillator can be applied to an electronic device requiring high speed operation.

In this manner, using the production method and processing apparatus according to the present invention, as was the case with ICs, SMDs (surface mounted devices) which are small and light with precise stable high resonance frequencies can be produced with a high degree of reliability. Furthermore, since piezoelectric elements with these superior characteristics can be offered in a high productivity by means of the present invention, light weight, small size and high speed communication devices and data processing devices can be provided using those piezoelectric elements.

In accordance with the description provided above, through the use of a production method and processing apparatus in accordance with the present invention, a piezoelectric element with a highly precise resonance frequency can be produced by a frequency adjustment method using plasma more efficiently than plasma methods disclosed in the related art. However, with the present invention, the resonance frequency can be monitored during the adjustment of the resonance frequency, and the processing rate can be established in the state wherein the radiation source is stable. Furthermore, it can easily be applied to each of the peculiar states of a piezoelectric element, thereby enabling the offering of a piezoelectric element having few variations in terms of resonance frequency. Also, piezoelectric elements produced by means of the present invention have good aging characteristics, enabling the attainment of very stable performance.

Also, since the frequency adjustment can be accomplished while monitoring the resonance frequencies, experience or intuition is not needed to achieve highly precise adjustment. Moreover, there are no problems related to excessive adjustment of the frequencies. Furthermore, with the production method or processing apparatus according to the present invention, the production process for the piezoelectric elements can be automated, thereby enabling their efficient manufacture. In addition, since frequency adjustment can be accomplished in multiple divided stages, faster and finer tuning of frequency adjustment can be simultaneously accomplished, in a frequency adjustment method using a plasma.

What is claimed is:

1. An apparatus for processing a piezoelectric element including an electrode, comprising:
   means for emitting particles toward said electrode of said piezoelectric element for removing material from a surface of said electrode by collision of said particles with said surface;
   frequency measurement means for measuring a resonance frequency of said piezoelectric element while said means for emitting particles is emitting particles and removing said material from said surface of said electrode;
   electrical connection means for connecting said piezoelectric element to said frequency measurement means; and
   a high-pass frequency filter including an electrical coil, wherein said electrical connection means is between said electrode and said electrical coil, said electrical coil connecting the electrode to ground.

2. The apparatus of claim 1, wherein said high pass frequency filter further includes a capacitor between said electrode and said frequency measurement means.

3. The apparatus of claim 1, wherein said high pass frequency filter further includes a resistor between said electrode and said electrical coil, and wherein said resistor is connected in series with said electrical coil.

4. The apparatus of claim 1, wherein said particles comprise ions.

5. The apparatus of claim 1, wherein said frequency measurement means comprises a network analyzer.

6. The apparatus of claim 1, wherein said frequency measurement means comprises an oscillator and a frequency counter.

7. An apparatus for processing a piezoelectric element including an electrode, comprising:
   means for emitting particles toward said electrode of said piezoelectric element and for removing material from a surface of said electrode by collisions of said particles with said surface in order to increase the resonance frequency of said piezoelectric element; and
   control means for changing the distance between said means for emitting particles and said surface of said electrode along a path of the particles based on a frequency difference between a desired frequency and the resonance frequency.

8. The apparatus of claim 7, further comprising:
   frequency measurement means for measuring the resonance frequency of said piezoelectric element; and
   frequency filter means for preventing low frequency components of electricity from passing through said electrode to said frequency measurement means.

9. The apparatus of claim 8, further comprising electrical communication means for electrically connecting said frequency measurement means to said control means.

10. The apparatus of claim 8, wherein said frequency measurement means comprises a network analyzer.

11. The apparatus of claim 8, wherein said frequency measurement means comprises an oscillator and a frequency counter.

12. The apparatus of claim 7, wherein said particles comprise ions.

13. An apparatus for processing a piezoelectric element including an electrode, comprising:
   first means for emitting first particles toward said electrode of said piezoelectric element when the piezoelectric element is placed in a first position, the first particles removing material from a surface of said electrode by collisions of said first particles with said surface in order to increase the resonance frequency of said piezoelectric element;
   second means for emitting second particles toward said electrode of said piezoelectric element when the piezoelectric element is moved to a second position, the second position being different from the first position, the second particles removing material from said surface of said electrode by collisions of said second particles with said surface in order to increase the resonance frequency of said piezoelectric element; and
   conveyance means for sequentially aligning said electrode in the first position and then in the second position.

14. The apparatus of claim 13, wherein said first means for emitting first particles provides higher energy irradiation of particles to said surface of said electrode than said second means for emitting second particles.

15. The apparatus of claim 13, further comprising first control means for changing the distance between said first means for emitting said first particles and said electrode and second control means for changing the distance between said second means for emitting said second particles and said electrode.

16. The apparatus of claim 15, further comprising:
   a frequency measurement means for measuring the resonance frequency of said piezoelectric element while said first and second means for emitting said first and said second particles are emitting said first and said second particles toward said electrode; and
   a frequency filter means for passing low frequency components of the current flowing to said electrode to ground to prevent said low frequency components of current from passing through said electrode to said frequency measurement means.

17. The apparatus of claim 16, further comprising electrical communication means for electrically connecting said frequency measurement means to said first control means and to said second control means.

18. The apparatus of claim 13, further comprising:
   frequency measurement means for measuring the resonance frequency of said piezoelectric element when said first means for emitting said first particles or said second means for emitting said second particles is emitting said first particles or said second particles toward said electrode; and
   frequency filter means for passing low frequency components of a current flowing to said electrode to ground to prevent said low frequency components of current from passing through said electrode to said frequency measurement means.

19. The apparatus of claim 13, wherein said first and said second particles emitted from both said first means for emitting said first particles and said second means for emitting said second particles comprise ions.

20. A method of processing a piezoelectric element to obtain a desired resonance frequency, comprising the following steps:

(a) forming a metallic electrode with an electrode surface onto at least a part of a surface of said piezoelectric element;

(b) emitting particles from a radiation source toward said electrode surface;

(c) removing material from said electrode surface by collisions of said particles with said electrode surface;

(d) measuring a resonance frequency of said piezoelectric element while said material is being removed from said electrode surface by said collisions; and (e) passing low frequency components of a current flowing to said metallic electrode to ground through an electrical coil to prevent said low frequencies from interfering with the measurement of said resonance frequency.

21. A method of processing a piezoelectric element to obtain a desired resonance frequency, comprising the following steps:

(a) emitting particles from a radiation source toward said piezoelectric element;

(b) changing the distance between said radiation source and said piezoelectric element while particles are being emitted.

22. The method of claim 20, wherein said particles comprise ions.

23. A method of processing a piezoelectric element to obtain a desired resonance frequency, said piezoelectric element including an electrode with an electrode surface, said method comprising the following steps:

(a) emitting particles from a radiation source toward an electrode surface;

(b) removing material from said electrode surface by collisions of said particles with said electrode surface;

(c) measuring a resonance frequency of said piezoelectric element while said material is being removed from said electrode surface by said collisions; and (d) controlling the distance between said electrode surface and said radiation source based on the resonance frequency of said piezoelectric element measured while said material is being removed from said electrode surface by said collisions.

24. The method of claim 23, wherein said particles comprise ions.

25. A method of processing a piezoelectric element to obtain a desired resonance frequency, said piezoelectric element including an electrode with an electrode surface, said method comprising the following steps:

(a) aligning said piezoelectric element with a first radiation source by placing the piezoelectric element in a first position;

(b) emitting first particles from said first radiation source toward said electrode surface to remove material from said surface by collisions of said first particles with said surface in order to increase the resonance frequency of said piezoelectric element;

(c) aligning said electrode with a second radiation source by moving the piezoelectric element to a second position, said second position being different from the first position; and (d) emitting second particles from said second radiation source toward said electrode surface to remove material from said surface by collisions of said second particles with said surface in order to increase the resonance frequency of the piezoelectric element.

26. The method of claim 25, wherein said first particles provide higher energy irradiation to said electrode surface than said second particles.

27. The method of claim 25, further comprising the following steps:

(e) measuring the resonance frequency of said piezoelectric element while said first radiation source is emitting said first particles toward said electrode and while said second radiation source is emitting said second particles toward said electrode;

(f) passing low frequency components of a current flowing to said electrode to ground to prevent said low frequency components of the current from passing through said electrode to a frequency measurement means;

(g) providing an electrical signal to a control means based on the resonance frequency determined by said frequency measurement means;

(h) changing the distance between said piezoelectric element and at least one of said first radiation source and said second radiation source based on said electrical signal by said control means;

(i) determining when the measured resonance frequency is at a predetermined frequency; and (j) performing step (c) when the measured resonance frequency is at said predetermined frequency.

28. The method of claim 25, wherein said particles comprise ions.

29. The apparatus of claim 8, wherein the frequency filter means prevents direct current from flowing to the frequency measurement means.

30. The apparatus of claim 16, wherein the frequency filter means passes direct current to ground.

31. The apparatus of claim 18, wherein the frequency filter means passes direct current to ground.

32. The method of claim 20, wherein step (e) further comprises:

passing direct current to ground.

33. The method of claim 27, wherein step (f) further comprises:

passing direct current to ground.

* * * * *